United States Patent [19]
Van Lankvelt

[11] Patent Number: 5,397,982
[45] Date of Patent: Mar. 14, 1995

[54] RELEASABLE SENSOR FOR CONDUCTOR FAULT DETECTION INCLUDING A RIGID TRIGGER ARM

[75] Inventor: Theodore Van Lankvelt, Elm Grove, Wis.

[73] Assignee: Cooper Industries, Inc., Houston, Tex.

[21] Appl. No.: 951,148

[22] Filed: Sep. 25, 1992

[51] Int. Cl.⁶ ............................................. H01R 13/627
[52] U.S. Cl. ................................... 324/126; 324/543; 439/477
[58] Field of Search ................... 24/133, 338, 346; 324/126, 133, 539, 543, 555; 439/477, 478, 479, 352

[56] References Cited

U.S. PATENT DOCUMENTS

| | | | |
|---|---|---|---|
| 1,862,073 | 6/1932 | Woolson | 439/477 |
| 3,036,286 | 5/1962 | Gore et al. | 439/479 |
| 4,045,726 | 8/1977 | Schweitzer, Jr. | 324/51 |
| 4,086,529 | 4/1978 | Schweitzer, Jr. | 324/543 X |
| 4,097,108 | 6/1978 | Prodel | 439/477 X |
| 4,384,289 | 5/1983 | Stillwell et al. | 324/126 X |
| 4,646,006 | 2/1987 | Schweitzer, Jr. | 324/127 |
| 4,795,982 | 1/1989 | Schweitzer, Jr. | 324/508 |
| 4,846,725 | 7/1989 | Williams et al. | 439/479 |
| 4,881,028 | 11/1989 | Bright | 324/127 |

Primary Examiner—Kenneth A. Wieder
Assistant Examiner—Christopher M. Tobin
Attorney, Agent, or Firm—William E. Shull

[57] ABSTRACT

A faulted circuit sensor is disposed in a releasable and reusable clamp mountable on an electrical conductor. The clamp includes a body for receiving the faulted circuit sensor indicating circuitry, and a pair of hinged fingers which actuate over the conductor to grip the clamp to the conductor and align the fault indicating circuitry with respect to the conductor. The fingers include a triggering arm which causes the arms to engage over the conductor when the conductor is properly aligned in the proximity of the clamp.

21 Claims, 5 Drawing Sheets

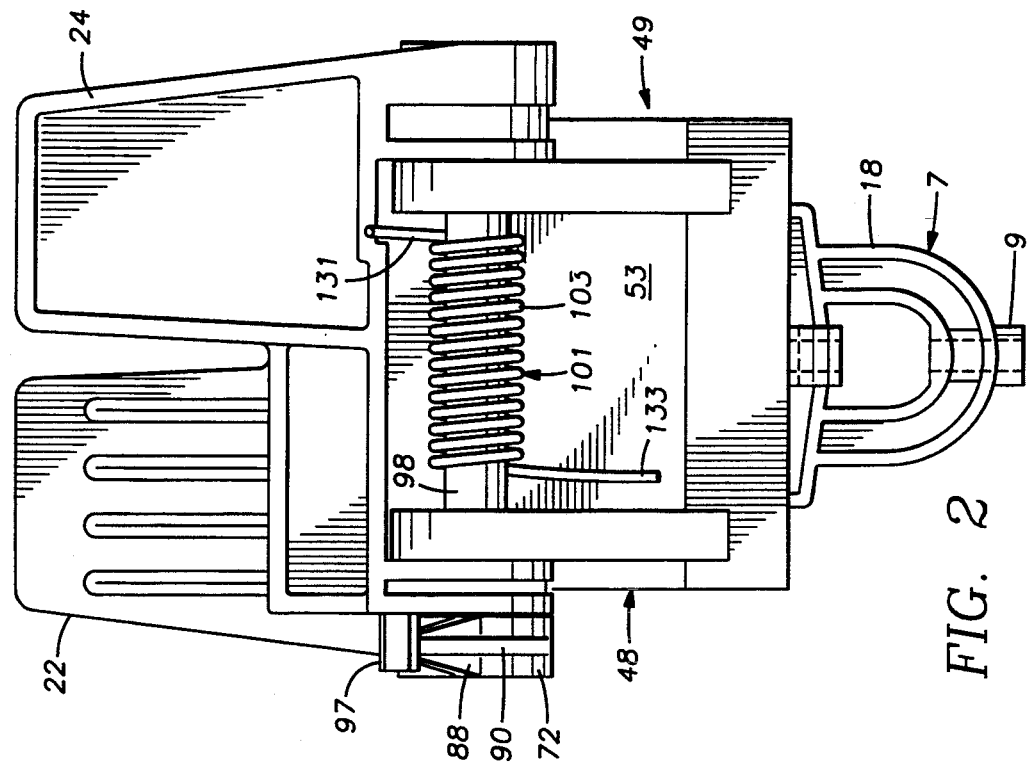
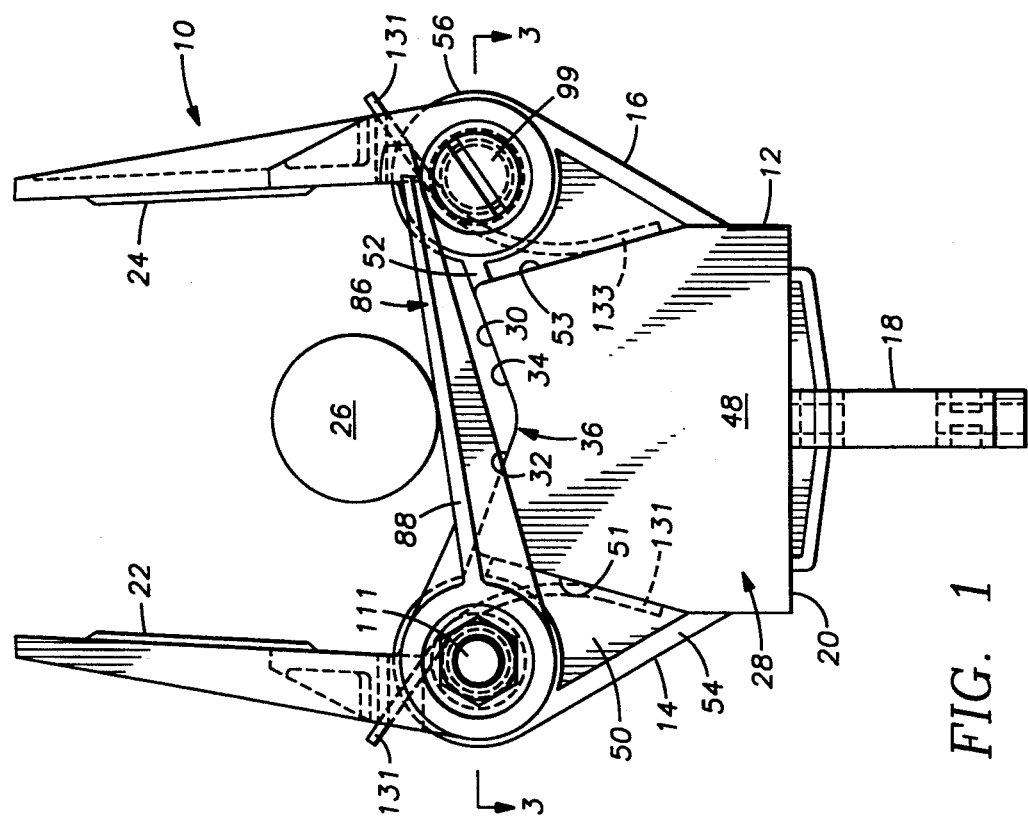

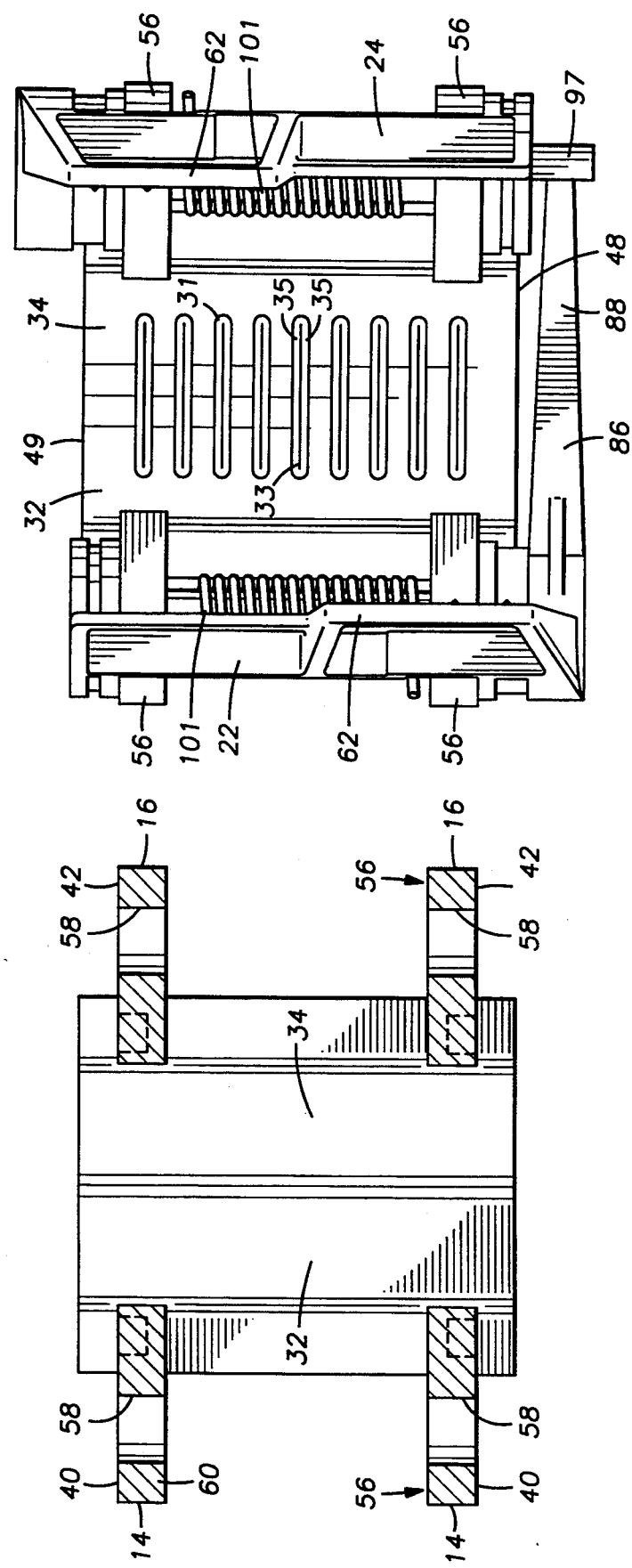

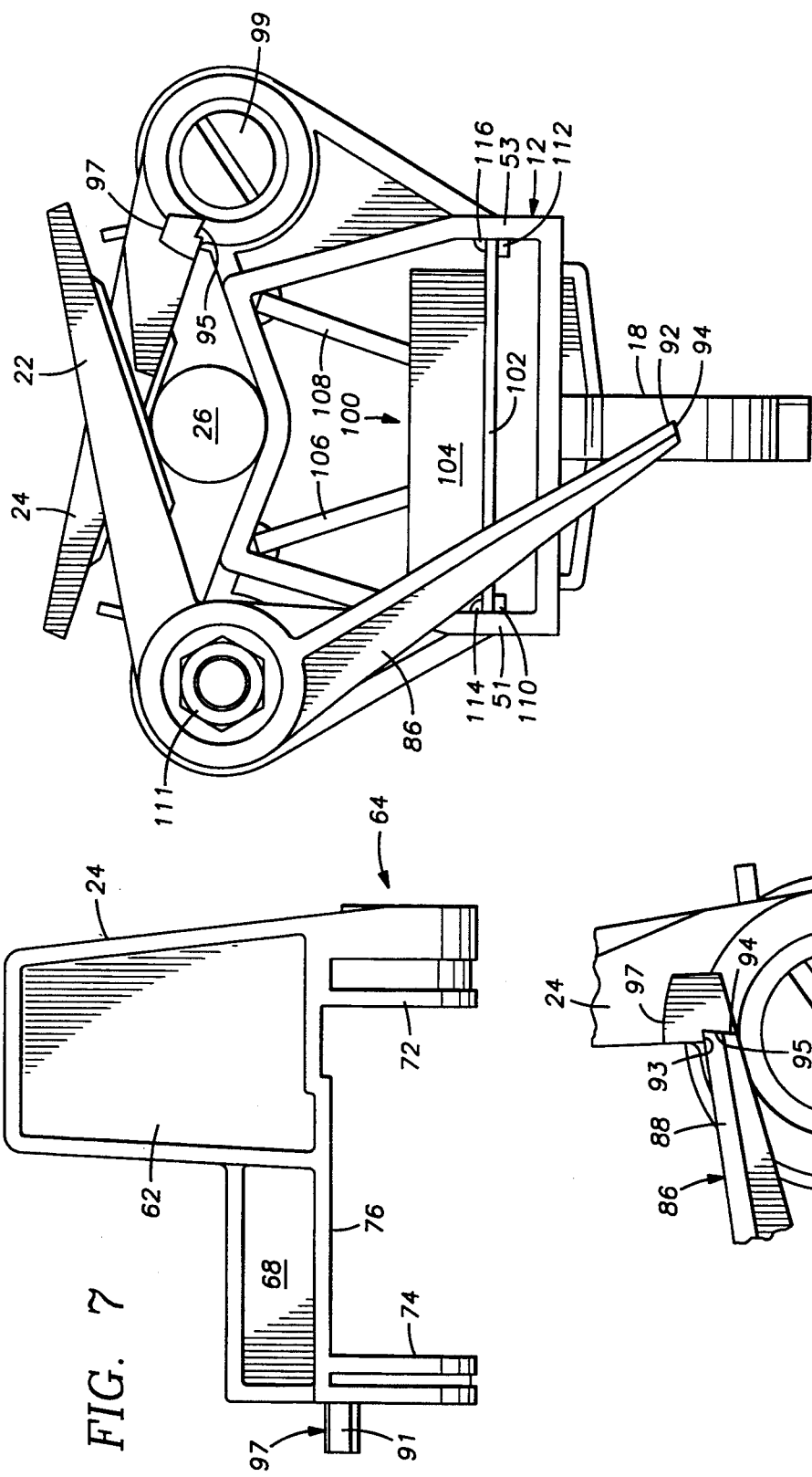

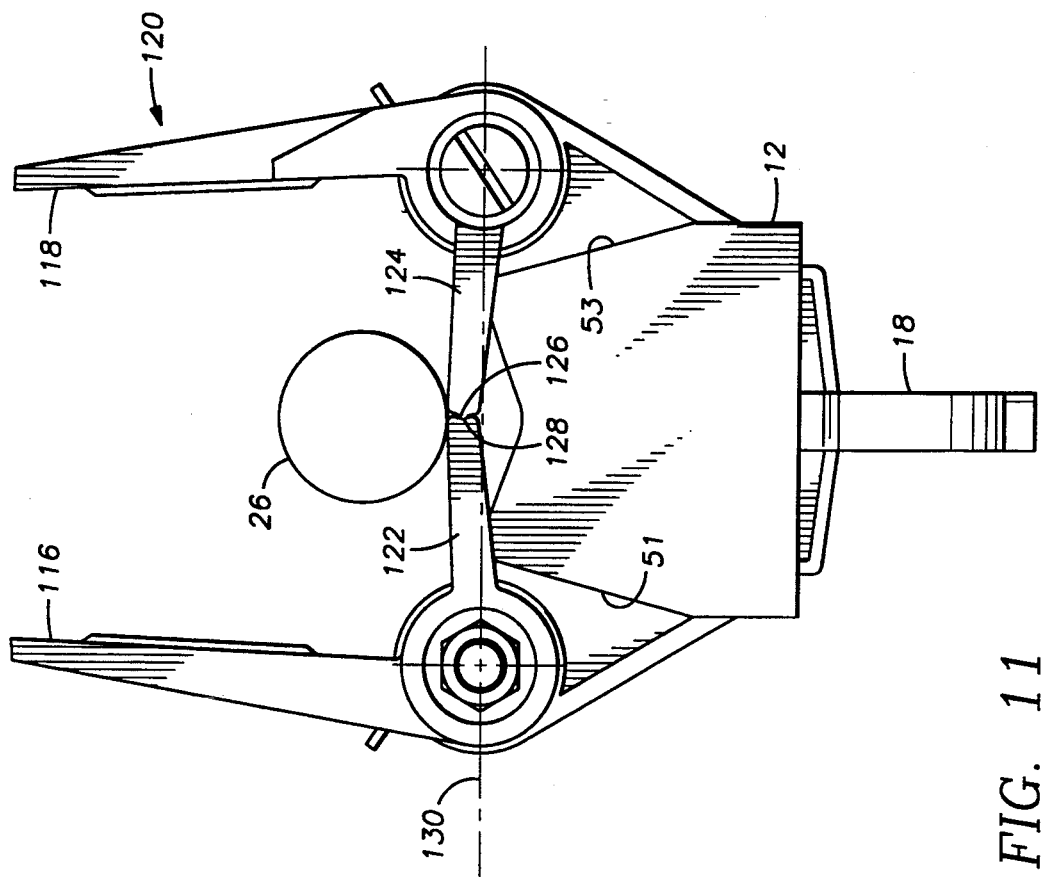
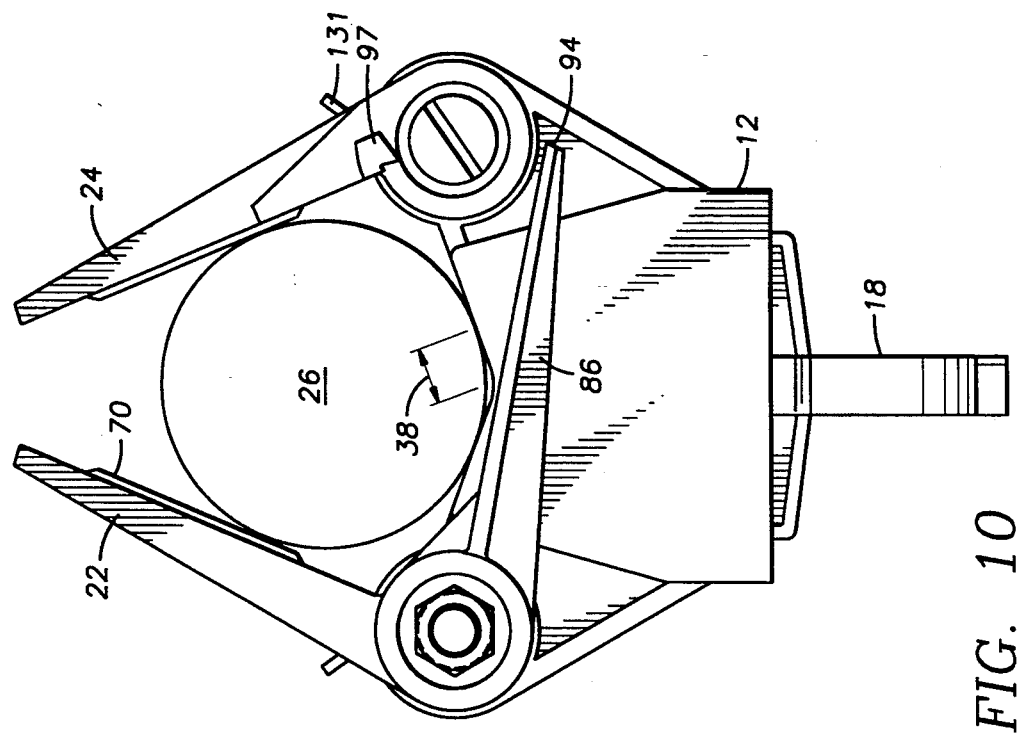
FIG. 11
FIG. 10

RELEASABLE SENSOR FOR CONDUCTOR FAULT DETECTION INCLUDING A RIGID TRIGGER ARM

BACKGROUND OF THE INVENTION

The present invention relates generally to the field of fault sensing and fault indicating apparatus. More particularly the invention relates to faulted circuit detecting apparatus having a sensing device located on or adjacent to monitored conductors of a distribution network. Still more particularly the invention relates to engagement devices employed to releasably attach the fault sensing apparatus to a monitored conductor.

Fault detectors of various types have been employed for detecting faults in electrical power distribution networks and for providing visual indication that such a fault has been detected. Such detectors commonly include a sensor portion, which is located adjacent to or positioned about a load carrying conductor in the power distribution network, and an indicator which indicates the presence or absence of a fault in the circuit. The sensor is typically an encircling looped device which is clamped directly over the conductor to be monitored. The loop may be loosely affixed over the conductor, or tightly pulled thereover. An indicator is communicatively connected to the sensor portion and is often mounted at a remote location with respect to the sensor so as to provide a more convenient observation point for workmen. Upon receipt of a signal from the sensor that a fault of a predetermined magnitude has occurred, the indicator displays a visual indication that a fault or disturbance has been detected in the monitored circuit.

Fault sensors operate through the application of a basic physical principle that current passing through a conductor will create a magnetic field about the conductor that is proportional to the magnitude of the current flowing through the conductor. By placing an inductive device in the magnetic field, a current will be induced in the inductive device when the device is interconnected into a circuit of the faulted circuit detector. In this manner, a fault current in the monitored conductor can be detected, as the current in the detector circuit will increase proportionally with that in the monitored conductor when a fault circuit passes through the monitored conductor.

Various apparatus have been used to attach the sensor of a faulted circuit detector into or onto the distribution circuit that is to be monitored. For example, U.S. Pat. No. 4,795,982 discusses the application of a faulted circuit indicator to a plug-in elbow connector, wherein the elbow includes a specialized aperture for receiving the fault sensing device. Likewise, U.S. Pat. No. 4,045,726 discusses an elbow mounted faulted circuit detector. In both instances, the electric distribution network must include a specialized component which is modified to accept the fault detector.

U.S. Pat. No. 4,881,028 discusses the application of a magnetic loop, disposed around a monitored conductor, as a means of determining the presence of a fault in the conductor. The reference does not disclose how the loop is to be placed over the conductor.

A variety of electrical testing apparatus also uses the magnetic field effect of the current passing through conductors to determine the voltage and amperage being drawn by electrical equipment such as motors. Such testing equipment is intended for light duty use, in instances where the operator can safely physically touch the insulated conductor which is being evaluated, without danger of shock or other harm. The detector of such testing apparatus is positioned adjacent to the insulated conductor that is to be evaluated, and a pair of jaws are articulated over and around the conductor being evaluated. The jaws of the detector form an aperture which is substantially larger than the diameter of the conductor. The detector is held in the operator's hand, and the jaws are articulated by a manually operated lever controlled by the operator. Electronics in the testing device yield a digital or analog indication of the voltage and amperage in the monitored conductor during operation of the motor or other current drawing equipment comprising the load on the circuit.

A variety of faulted circuit indicating apparatus has been used in the past, which must be applied to the monitored conductor while the conductor is in an unenergized condition. That is particularly disadvantageous, because it requires that the circuit in which the conductor is located be de-energized, thereby cutting off the power in the circuit to the end users. Additionally, any time that type of prior art apparatus is removed or replaced, the circuit must be de-energized. This is a time consuming process for the linesman, and inconveniences power users.

Another problem with many types of prior art faulted circuit indicating devices is that they are not easily removable once installed, in the event the operator wishes to install the indicator at another location. For example, some types of prior art devices are installed with tie wraps which must be cut to remove the device from the conductor.

Faulted circuit indicating devices have also been used in the past which may be placed on a conductor while energized. For these types of devices, a hot stick is commonly employed as a means of placing the indicating apparatus on, and removing it from, the energized conductor. However, such devices as these have a common drawback in that they are not readily placeable on certain conductors due to physical constraints imposed by the structure utilizing the conductor. For example, certain conductors disposed below the heavy metal plates of some types of transformer cells are inaccessible with the hot stick mounting apparatus and faulted circuit indicating means used in the past, because such prior art hot sticks and indicators are typically unable to be angled properly with respect to one another for access to and placement on the conductors.

SUMMARY OF THE INVENTION

The present invention comprises a readily installable and removable, reusable fault circuit indicator clamping apparatus adapted for releasable attachment to a conductor in an electrical distribution network to locate the fault indicator circuitry adjacent the conductor to detect the presence of a fault in the circuit to which the conductor is connected. The indicator clamp includes a body portion constructed of an insulative material such as plastic or plastic reinforced fiberglass which encloses the faulted circuit indicator circuitry, and a pair of plastic flipper fingers disposed on the plastic body for arcuate movement with respect thereto to engage the conductor against the body. The body, with the fingers spread to a cocked or open position, is placed over the conductor with a hot stick. As the fingers pass the sides of the cable, a trigger on one of the fingers is engaged against the conductor. Further movement of the clamp over the conductor releases the trigger, and the fingers are spring-actuated about their axes to engage and grip the conductor with sufficient force to properly align the sensing and electronic components of the indicator adjacent the conductor and maintain the indicator thereon for an indefinite period of time. If desired, the operator may easily remove the clamp from the conductor by attaching the hot stick thereto and pulling it away from the conductor.

The present invention may also be readily placed on those types of conductors referred to above as being relatively inaccessible to prior art hot sticks and indicating devices, because it permits the hot stick and indicator to be angled properly with respect to one another for easy access to and placement on the conductors.

Thus, the present invention comprises a combination of features and advantages which enable it to substantially advance faulted circuit indication by providing an easily applied and readily removable indicating circuit housing.

These and other objects and advantages of the invention will become apparent to those skilled in the art from the following detailed description of the preferred embodiment of the invention when read in conjunction with reference to the following drawings, wherein:

BRIEF DESCRIPTION OF THE DRAWINGS

FIG. 1 is an end-on view of the releasable sensor of the present invention shown with the clamping fingers in the open position;

FIG. 2 is a right side view of the releasable sensor of FIG. 1;

FIG. 3 is a partial cutaway view of the body of the releasable sensor of FIG. 1, taken along section lines 3—3 of FIG. 1;

FIG. 4 is a plan view of the releasable sensor of FIG. 1;

FIG. 7 is a side view of the other of the clamping fingers of the releasable sensor of FIG. 1, taken from outside the device;

FIG. 8 is a fragmentary view of a portion of the releasable sensor of FIG. 1, showing in detail the trigger arm mechanism in cocked or armed position;

FIG. 9 is an end-on view of the releasable sensor of FIG. 1, shown with the clamping fingers actuated about a conductor and with a portion of the body cut away to reveal additional structure;

FIG. 10 is an end-on view of the releasable sensor of FIG. 1, shown with the fingers actuated over a larger conductor than that shown in FIG. 9; and FIG. 11 is an end-on view of an alternative embodiment of the releasable sensor of the present invention, shown with the clamping fingers in the open position.

DETAILED DESCRIPTION OF THE PREFERRED EMBODIMENTS OF THE INVENTION

Figure 6:
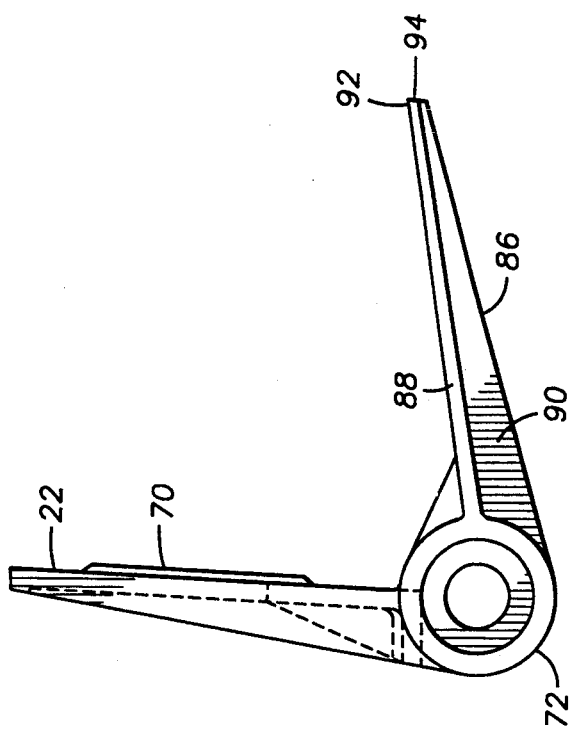
FIG. 6 is an end-on view of the clamping finger of FIG. 5.

Referring first to FIGS. 1 through 10, the releasable sensor of the present invention is indicated generally at 10. Releasable sensor 10 is comprised of a generally box-like body portion 12 having a pair of mounting branches 14, 16 disposed on each side thereof, a hot stick mounting projection 18, and a pair of spring-actuated clamping fingers 22, 24 pivotably attached thereto. As explained more fully below, to grip a conductor 26 in a distribution network, a linesman or other operator attaches a hot stick to the hot stick mounting projection 18 with the clamping fingers 22, 24 of releasable sensor 10 in the open, cocked or armed position shown in FIG. 1. The releasable sensor 10 is then placed over a conductor 26 and pressed against it. This pressure releases a trigger mechanism and actuates the clamping fingers 22, 24 to pivot about their axes within mounting branches 14, 16, to engage and grip the conductor.

The hot stick mounting portion 18 of the present invention includes a substantially U-shaped attachment loop 7 to which the grasping hook of a hot stick (not shown) is secured, by the operator's actuation of a lever on the hot stick to pull the indicator 10 tight to the hot stick, as is known in the art. The mounting portion 18 further includes a threaded bore 9 for receiving a screw or pin (not shown) which may be sized such that when the lever is actuated, it engages the arm of the hot stick upon the indicator 10 being rotated to a predetermined angle, for example about 45°, with respect to the arm. Engagement of the pin or screw disposed in bore 9 with the arm of the hot stick prevents further rotation of the indicator 10 with respect to the arm, thereby enabling the indicator to be maintained at the predetermined angle during use of the indicator. Different lengths of pins or screws may be used to accommodate different types or styles of hot sticks, made by different manufacturers. With this feature, the indicator 10 of the present invention may be placed on even those types of difficult conductors referred to above which are disposed beneath the referenced transformer cells, because they can be approached at a high angle rather than straight on, with reference being made here to the angle between the hot stick and the indicator 10.

It should be understood that whenever terms such as upper, lower, vertical, horizontal, or the like are used in this description, they are relative terms only, and are used simply to relate to and easily describe the device of the present invention when oriented substantially as shown in the drawings. Accordingly, it will be appreciated that the device need not be considered as having a true "top" or "bottom" or the like; rather, these terms have meaning herein only in the above-referenced relative sense.

Referring now to FIGS. 1 to 4, body portion 12 preferably comprises an enclosed, one-piece molded member comprising a relatively thin-walled box portion 28 having a bottom wall or panel 20, an angled upper surface portion 30, and opposed side walls 51, 53. Two pairs 14, 16 of substantially identical mounting branches are supported from side walls 51, 53, respectively, and extend upwardly beyond angled upper surface portion 30. One end of body portion 12 is closed by a cover 48, and the other end is closed by a cover 49. Body portion 12 is substantially symmetrical, whereby rotation of body portion 12 by 180° about the center of bottom wall or panel 20 presents a substantially identical profile as compared to that prior to such rotation.

Angled upper surface portion 30 comprises a pair of inwardly sloping walls 32, 34 which extend from the sides and join in the center of body portion 12, and which form a relatively large obtuse angle 36 at the center thereof. The two pairs of mounting branches 14, 16 are preferably integrally joined with a portion of side walls 51, 53, and with a portion of upper sloping walls 32, 34 opposite angle 36. As best shown in FIG. 4, a plurality of parallel ribs 31 are disposed across the faces of upper sloping walls 32, 34, each of which terminates in a relatively sharp ridge 33. Each rib 31 is preferably about 0.05 inches in height, including ridge 33. The adjacent flanks 35 of each rib are preferably perpendicular to one another, such that the ribs form a fight triangular cross section with the point of the ribs defining a 90° angle. Angled upper surface portion 30 is sized to permit a conductor 26 of the maximum expected size to be nested or cradled against the sloping walls 32, 34 in the center of the upper surface portion while fingers 22, 24 grip the conductor 26 and press it against the sloping walls. As the diameter of conductor 26 is increased, the distance 38 (Shown in FIG. 10) on walls 32, 34 from center angle 36 where the outer circumference of conductor 26 bears against walls 32, 34 is increased. Angle 36 and sloping walls 32, 34 are sized to cradle and center conductor 26 against the sloping walls, and thus to center or align, and to fix the position of, the conductor 26 with respect to the body 12 of releasable sensor 10.

Mounting branch pairs 14, 16 are disposed on body 12 such that they are substantially in register with and opposite one another and substantially equidistant from angle 36. Each mounting branch pair 14, 16 includes a pair of parallel tab portions 40, 42, respectively, which extend outwardly from side walls 51, 53 and project upwardly beyond angled upper surface portion 30. Tab portions 40, 42 each include a support web portion 50 having an upper and a lower stiffening rib 52, 54. Tabs 40, 42 terminate at a barrel portion 56 which comprises a fight circular tubular, i.e., annular, member having a barrel bore 58 surrounded by an annular barrel wall 60. The outer portion of barrel wall 60 may comprise a continuation of stiffening rib 54. Barrel portions 56 are disposed on tab portions 40, 42 so that the barrel bores 58 of tabs 40, 42, respectively, are substantially aligned or in register with one another. Tab portions 40, 42 are sized to locate barrel bores 58 a predetermined distance from angle 36 to ensure proper gripping and placement of the conductor 26 in releasable sensor 10, as further described herein.

Cover 48 is disposed on one end of body portion 12, and extends beyond the end face of mounting branches 14, 16. Cover 49 is disposed on the other end of body portion 12 and also projects beyond the adjacent end faces of mounting branches 14, 16.

Figure 5:
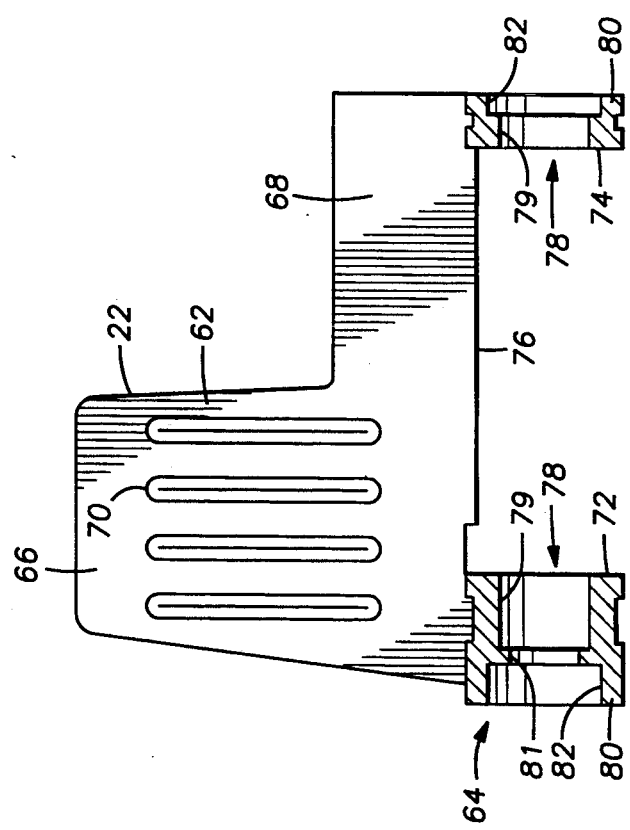
FIG. 5 is a side view of one of the clamping fingers of the releasable sensor of FIG. 1, taken from inside the device.

Referring now to FIGS. 1 through 8, each finger 22, 24 includes a flipper portion 62 and a gimble mounting portion 64 for attachment of fingers 22, 24 to tabs 40, 42, respectively. Flipper portion 62 is configured generally in the shape of the letter P, with the rounded portion of the P forming a gripping surface 66 and the leg or upright portion of the P forming a base 68 for gimble mounting portion 64. A plurality of raised ribs 70 are disposed on the inside face of each flipper portion 62, and are preferably disposed substantially parallel to one another and transverse to base 68 of flipper portion 62. These fibs are best shown in FIG. 5. There are preferably four such ribs, but a greater or lesser number could be used, as desired.

Gimble mounting portion 64 includes a pair of knuckles 72, 74 disposed on opposite ends thereof, forming a gap 76 therebetween. Each knuckle 72, 74 comprises a fight circular tubular, i.e., annular, member disposed on, and projecting from, gimble mounting portion 64, and includes a knuckle bore 78 and an annular knuckle body 80 disposed circumferentially thereabout. Fingers 22 and 24 are substantially identical, except as noted otherwise. Knuckles 72, 74 of finger 22 are shown in cross section in FIG. 5, and ribs 70 of finger 22 are depicted in FIGS. 2 and 5, but substantially identical features are found in finger 24. Knuckles 72, 74 each include an inner bore 79 on their inner ends, and an enlarged counterbore 82 on their outer ends. Knuckle 72 also includes a reduced diameter bore 81 between inner bore 79 and enlarged counterbore 82.

In addition to the common features of fingers 22, 24, finger 22 further includes a trigger arm 86 projecting from first knuckle 72. Trigger arm 86 is an elongated member having an upper flange portion 88 and a downwardly extending body or web portion 90 integrally connected to the upper flange portion. The flange portion 88 of arm 86 is narrower at its free end than it is near knuckle 72, and its thickness from its top surface to its bottom surface is slightly less at its free end than near knuckle 72. Thus, flange portion 88 of arm 86 tapers slightly and narrows from near knuckle 72 to its free end. Web portion 90 is of substantially the same thickness along its length, as shown in FIG. 2, but its height decreases from knuckle 72 outwardly to its free end, as shown in FIGS. 1 and 6. Free end 92 of arm 86 includes a back taper end face 94, which extends from the upper surface of flange portion 88 through the lower edge of web 90. The lower edge of support web 90 preferably extends toward knuckle 72 at an angle of about 5°, plus or minus about 2°, with respect to the lower face of upper flange portion 88. The upper face of flange portion 88 is preferably disposed at an angle of approximately 1° with respect to the lower face of flange portion 88. Back taper end face 94 is preferably disposed at an angle of about 15.5° with respect to the lower face of flange portion 88. Flipper portion 62 and trigger arm 86 are angularly disposed with respect to one another such that when releasable sensor 10 is in the cocked or armed position, flipper portion 62 extends nearly vertically upwardly from the device as shown in FIG. 1; trigger arm 86 extends across the device, beyond and clear of the end edges of sloping walls 32, 34 as shown in FIGS. 2 and 4; and free end 92 is disposed adjacent finger 24 as shown in FIGS. 1 and 4. It can be seen that in this cocked or armed position, the trigger arm 86 is disposed at an angle to the horizontal; i.e., at an angle to a plane through the pivot axes of fingers 22, 24.

Finger 24 is substantially similar to finger 22, except that it does not include trigger arm 86 but instead includes trigger receptacle 97 disposed thereon to receive free end 92 of trigger arm 86. Trigger receptacle 97 is disposed on one end of finger 24 and projects outwardly therefrom adjacent the upper portion of knuckle 74. Referring now to FIGS. 7 and 8, trigger receptacle 97 comprises a boss or projection 91 extending from the lower portion of base 68 adjacent knuckle 74. Boss or projection 91 includes a limit wall 93 and a back cut wall 95, which serve to selectively position and hold trigger arm 86 of sensor 10 in the cocked or armed position prior to attachment of the sensor to a conductor, and to release trigger arm 86 upon engagement of the sensor over a conductor 26. Back cut wall 95 is disposed at an angle of approximately 85° to limit wall 93.

When fingers 22, 24 are disposed as shown in FIG. 1, back taper end face 94 of end 92 of arm 86 is engaged against back cut wall 95, and the upper surface of flange 88 at end 92 is disposed against or immediately adjacent limit wall 93. When fingers 22 and 24 are placed into the opened or cocked position shown in FIG. 1, arm 86 must be articulated such that end 92 thereof is so engaged into receptacle 97. Such engagement of end 92 of arm 86 with walls 93, 95 of receptacle 97 prevents arcuate movement of fingers 22, 24 toward the conductor-gripping position of FIG. 9 until arm 86 is pressed and forced out of contact with the receptacle 97. Thus, the interface of arm 86 and receptacle 97 prevents arm 86 and finger 22 attached thereto from moving into actuated position, and also prevents finger 24 from moving into actuated position until arm 86 is moved out of engagement with the receptacle 97 by being forced against the conductor 26.

Referring now to FIGS. 1, 4 and 8, for proper operation, mounting branch pairs 14, 16 are disposed on body portion 12 to receive knuckles 72, 74 and barrel portions 56 such that their bores 78, 58 are aligned, and to locate end 92 of arm 86 such that it will be received within trigger receptacle 97. Finger 22 is placed on body 12 such that its flipper portion 62 is disposed near one end 48 of the body, and finger 24 is placed on body 12 such that its flipper portion 62 is disposed near the body's other end 49. An actuating spring 101, having a coil portion 103 and two stiff end wires 131, 133, is provided for each finger 22, 24 and is disposed in the spaces 76 between knuckles 72, 74 such that wire 131 is retained against the outside faces of flippers 22, 24 and the second wire 133 bears against the respective side wall 51, 53. Wire 133 of spring 101 associated with finger 22 is disposed against wall 51 near end cover 49, and wire 133 of spring 101 associated with finger 24 is disposed against wall 53 near end cover 48. Springs 101 are so disposed on body 12 and in engagement with fingers 22, 24 as to bias the fingers toward rotation about their pivot axes into conductor-gripping position.

To secure fingers 22, 24 and springs 101 to body 12, a pintle 98 is placed through the aligned bores 78, 58 and the coil windings of springs 101 on each side of the device of the invention, to allow fingers 22, 24 to actuate arcuately or pivot about the longitudinal axes of pintles 98. Pintles 98 are sized to be received within bores 78 of knuckles 72, 74, such that they do not extend from the outer ends of the knuckles. Pintles 98 may include an enlarged head portion 99 on one end which is received within one of the counterbores 82 of knuckles 72, 74, and a nut 111 may be disposed on the other end of the pintles and received in the other of the counterbores 82 to retain the pintles 98 in place. Alternatively, pintles 98 may be sized to be press fit within bores 58 of tabs 40, 42 to retain them on the body portion 12.

Once assembled as aforesaid, the springs 101 bias the fingers 22, 24 such that their respective flipper portions are located adjacent the upper angled surfaces 32, 34 of body 12; this can be considered the "disarmed" state or position of the sensor 10. In order to cock or arm the sensor 10 for placement on a conductor, fingers 22, 24 are pulled or rotated upwardly about pintles 98 and away from angled surfaces 32, 34, such that free end 92 of arm 86 is located in receptacle 97 with back taper end face 94 of arm 86 disposed against back cut wall 95 of finger 24. At this point, releasable sensor 10 is ready to be placed over a conductor 26 in a circuit with a hot stick or other tool releasably attached to mounting projection 18.

To engage a conductor 26 with releasable sensor 10, with the fingers cocked as aforesaid the flipper portions 62 are moved laterally over the conductor to straddle it as shown in FIG. 1. Sensor 10 is then moved further laterally against the conductor, such that the conductor is pressed against arm 86; this rotates the fingers 22, 24 toward one another and forces free end 92 of trigger arm 86 out of receptacle 97 when sufficient rotation has occurred. Arm 86 will pass freely over the end cover 48 of body portion 12 when it is released from receptacle 97 and urged downwardly by the spring force of spring 101. When a predetermined amount of force is exerted on flange 88 of arm 86 by pressing arm 86 against conductor 26, this causes sufficient rotation of the fingers 22, 24 toward one another to release end 92 of arm 86 from receptacle 97, at that point the frictional force holding back cut end face 94 against back cut wall 95 being overcome by the spring force. Once end 92 is removed from receptacle 97, there is no force countering that imparted by springs 101 on the back of flipper portions 62 by wires 131, and flipper portions 62 are faced to swing inward over the conductor 26. Angled upper surface portion 30 is constructed to self-center conductor 26 thereon, and ribs 31 are disposed thereon to prevent movement of the conductor 26 with respect to body 12. Likewise, raised ribs 70 of flipper portions 62 help to minimize the motion of conductor 26 relative to flipper portions 62.

To remove releasable sensor 10 from conductor 26, a hot stick or other insulated placement device is attached to mounting projection 18, and force is applied thereto to pull releasable sensor 10 away from conductor 26. As releasable sensor 10 is pulled away from conductor 26, flipper portions 62 initially rotate upwardly and outwardly about pintles 98, and the faces of flipper portions 62 slip over the outside of conductor 26. After removal of the conductor from the device 10, the fingers 22, 24 are actuated once again about pintles 98, back into their disarmed poistions. To reinstall releasable sensor 10, flipper portions 62 may again be cocked, with end 92 engaged in receptacle 97, and the installation process discussed above may then be repeated.

The configuration of releasable sensor 10 permits reinstallation or reuse of the clamp while assuring precision placement of the fault detection components adjacent the conductor 26. Referring to FIG. 9, fault detection equipment 100 is enclosed within the box-like body portion 12, and the inductive pickup therefor is located adjacent the underside of the upper angled wall 30. Fault detection equipment 100 includes a circuit board 102 having a logic chip 104 thereon, and a pair of inductive rods 106, 108 project therefrom to a position adjacent the interior of angled wall portion 30. Inductive rods 106, 108 detect current changes in the conductor 26, and transmit a signal to the logic circuit 104 in response thereto. To properly position rods 106, 108 with respect to upper angled wall 30, a pair of rails 110, 112 are positioned on the interior surface of side walls 51, 53, and circuit board 102 is disposed on and between the rails. Circuit board 102 includes indexing points to align the board properly with respect to rails 110, 112, and rods 106, 108 are fixed in a predetermined relationship to board 102. To secure board 102 and rods 106, 108 in place, the inner portions of walls 51, 53 may include an epoxy coating 114, 116 to maintain board 102 on rails 110, 112. The combination of rails 110, 112 and epoxy 114, 116 locks board 102 against movement within body 12. Alternatively, the interior of the body 12 may be substantially entirely filled with an appropriate potting material to secure the board 102 in place.

By assuring that the faulted circuit indicating components will be precisely located when placed over conductor 26, releasable sensor 10 may be used to detect surges, for example, in different sizes of conductors. The user, such as a linesman or electrician, need only ensure that the clamp is large enough to fit over the conductor being evaluated, and then press the clamp in place. There is no need to isolate or deaden the circuit under evaluation to place, or remove, the clamp. Further, there is no need to adjust the clamp to fit a specific conductor size. In addition, because most of the sensor 10 is comprised of non-conducting materials, the sensor may be placed or removed over an energized conductor, which eliminates the need to de-energize the conductor and cause inconvenience to users with a power outage or interruption.

Referring now to FIG. 11, an alternative embodiment of the clamp 120 is shown. In this embodiment, each of fingers 116, 118 includes an arm 122, 124 projecting therefrom. The free end of arm 122 includes a depression 126, which may be conical-shaped, for example, which receives a projection 128 on the free end of arm 124. Finger 116 is mounted on pintle 98 adjacent side wall 51, and finger 118 is engaged over pintle 98 adjacent side wall 53. The combined lengths of arms 122 and 124 from their pivot points is slightly greater than the distance between those pivot points, that is, the distance between pintles 98 on either side of body 12. Prior to engagement of clamp 120 over conductor 26, projection 128 is engaged into depression 126, and arms 122, 124 are thus abutting one another. Because the total length of arms 122, 124 is slightly greater than the distance between pintles 98 as referred to above, the engagement of arms 122 and 124 at ends 126, 128 occurs above the plane 130 through the centers of pintles 98. When in this position, each finger 116, 118 is stably positioned against rotation about pintles 98 in response to the force imposed on fingers 116, 118 by springs 101.

When clamp 120 is pressed over a conductor 26, the engagement of conductor 26 against arms 122, 124, and continued pressing of clamp 120 thereover, causes arms 122, 124 to actuate downwardly, past upper angled surface 30. Once arms 122, 124 have rotated sufficiently, the locking effect caused by insertion of projection 128 into depression 126 is reduced to the point where springs 101 actuate flippers 62 over conductor 26. In this position clamp 120 will stay on conductor 26 until removed. Again, clamp 120 may be reused by pulling it away from conductor 26 and resetting projection 128 into conical depression 126 forward of plane 130.

While preferred and alternative embodiments of the invention have been shown and described, many modifications thereof may be made by those skilled in the art without departing from the spirit of the invention. Therefore, the scope of the invention should be determined in accordance with the following claims.

I claim:

1. A sensor for sensing a faulted condition in a conductor, comprising;
   a protective body having faulted circuit indicating means disposed therewithin and a conductor supporting portion adapted for receiving and engaging the conductor in a predetermined position with respect to said faulted circuit indicating means;
   a gripping finger disposed on said protective body and having a conductor engaging portion and a finger mounting portion, said finger mounting portion being adapted for mounting said gripping finger on said body and permitting said conductor engaging portion to be moved alternately between an open position adjacent to but spaced from the conductor, and a closed position engaging the conductor and holding it in said predetermined position on said body;
   trigger means for holding said conductor engaging portion of said gripping finger in said open position prior to actuation of said trigger means, and for releasing said conductor engaging portion from said open position and permitting it to move to said closed position when actuated, said trigger means including a rigid trigger arm extending from said gripping finger in fixed angular relation to said conductor engaging portion, said trigger arm being movable between a cocked position, wherein said conductor engaging portion is held in said open position, and an actuated position wherein said conductor engaging portion is permitted to move to said closed position; and
   biasing means disposed between said gripping finger and said body for urging said conductor engaging portion of said gripping finger into said closed position upon actuation of said trigger means, said biasing means supplying all of the force to maintain the conductor in position in the sensor.

2. The sensor of claim 1, wherein said conductor supporting portion of said body includes self-centering means for moving said body relative to the conductor to fixedly align the conductor with said faulted circuit indicating means, upon movement of said conductor engaging portion of said gripping finger into said closed position.

3. The sensor of claim 2, wherein said self-centering means includes a substantially V-shaped angled surface having sloping sides adapted for engaging angularly spaced apart portions of the conductor with the apex of the V substantially centered therebetween, upon engagement of the conductor by said conductor engaging portion of said gripping finger.

4. The sensor of claim 1, wherein said finger mounting portion of said gripping finger includes means for cooperative engagement with said protective body for enabling rotation of said gripping finger on said body and correlative rotation of said conductor engaging portion between said open and closed positions.

5. The sensor of claim 4, wherein said protective body includes a pair of spaced apart mounting branches extending therefrom, each with an annular mounting ring disposed on its free end, the bores of said mounting rings being substantially coaxially aligned; and
   wherein said finger mounting portion of said gripping finger includes a gimble mounting portion fixed below said conductor engaging portion and having a pair of spaced apart annular knuckles each having a bore adapted for coaxial alignment with said annular mounting ring bores, and further including a pintle member disposed within said bores of said knuckles and said mounting rings for rotatably retaining said gimble mounting portion on said body.

6. The sensor of claim 5, wherein said biasing means includes a coil spring having a winding portion disposed on said pintle member between said knuckles, a first wire end abutting a wall of said protective body adjacent to said winding portion, and a second wire end abutting said conductor engaging portion of said gripping finger on an opposing side thereof for providing a spring force on such opposing side and urging said conductor engaging portion into closed position.

7. A sensor for sensing a faulted condition in a conductor, comprising;
   a protective body having faulted circuit indicating means disposed therewithin and a conductor supporting portion adapted for receiving and engaging the conductor in a predetermined position with respect to said faulted circuit indicating means;
   a gripping finger disposed on said protective body and having a conductor engaging portion and a finger mounting portion, said finger mounting portion being adapted for mounting said gripping finger on said body and permitting said conductor engaging portion to be moved alternately between an open position adjacent to but spaced from the conductor, and a closed position engaging the conductor and holding it in said predetermined position on said body;
   trigger means for holding said conductor engaging portion of said gripping finger in said open position prior to actuation of said trigger means, and for releasing said conductor engaging portion from said open position and permitting it to move to said closed position when actuated; and
   biasing means disposed between said gripping finger and said body for urging said conductor engaging portion of said gripping finger into said closed position upon actuation of said trigger means, said biasing means supplying all of the force to maintain the conductor in position in the sensor;
   wherein said trigger means includes a trigger arm extending from said gripping finger in fixed angular relation to said conductor engaging portion and having a free end, and a trigger arm receptacle disposed on said body for releasably receiving said free end of said trigger arm therewithin, said trigger arm and said receptacle being movable from a cocked position wherein said free end of said trigger arm is held in said receptacle against movement with respect to said body and said conductor engaging portion is held in said open position, and an actuated position wherein said free end of said trigger arm is released from said receptacle and said conductor engaging portion is permitted to move to said closed position.

8. The sensor of claim 7, wherein said gripping finger, having said trigger arm fixed thereto, and said receptacle are rotatably mounted on said body, and wherein said free end of said trigger arm includes means engageable with said receptacle for retaining said trigger arm within said receptacle in said cocked position, and for effecting oppositely directed rotation of said trigger arm and said receptacle from said cocked position to said actuated position upon engagement of said trigger arm against the conductor with a predetermined force.

9. The sensor of claim 8, wherein said receptacle includes a back cut wall engageable by a back taper surface on said free end of said trigger arm.

10. The sensor of claim 9, wherein said receptacle further includes a limit surface disposed over said back cut wall and engageable with an upper surface on said free end of said trigger arm.

11. The sensor of claim 8, including a second gripping finger rotatably disposed on said protective body and having a second conductor engaging portion rotatable between such open and closed positions, said trigger arm receptacle being mounted on said second gripping finger for rotation therewith.

12. The sensor of claim 1, wherein said conductor supporting portion of said body includes a plurality of raised ribs for assisting in gripping the conductor.

13. The sensor of claim 1, wherein said conductor engaging portion of said gripping finger includes a plurality of raised ribs for assisting in gripping the conductor.

14. The sensor of claim 11, wherein said conductor engaging portions of said gripping fingers, and said conductor supporting portion of said body, include a plurality of raised ribs on their surfaces which engage the conductor.

15. The sensor of claim 1 wherein said faulted circuit indicating means includes a circuit board, and further including mounting means disposed within said body and engageable with said faulted circuit indicating means for fixing the position of said circuit board inside said body.

16. The sensor of claim 7, wherein said trigger arm extends substantially transversely to said conductor engaging portion of said gripping finger such that when said conductor engaging portion is in said open position and extends generally away from the conductor supporting portion of said body, said trigger arm extends generally across said conductor supporting portion of said body, but beyond one end thereof in order to clear said body to permit said conductor engaging portion to move to said closed position.

17. A sensor for sensing a faulted condition in a conductor, comprising;
   a protective body having faulted circuit indicating means disposed therewithin and a conductor supporting portion adapted for receiving and engaging the conductor in a predetermined position with respect to said faulted circuit indicating means;
   a pair of gripping fingers disposed on opposite sides of said protective body and each having a conductor engaging portion and a finger mounting portion, said finger mounting portions being adapted for mounting said gripping fingers on said body and permitting said conductor engaging portions to be moved alternately between an open position adjacent to but spaced from the conductor, and a closed position engaging the conductor and holding it in said predetermined position on said body;
   trigger means disposed on said gripping fingers for holding said conductor engaging portions of said gripping fingers in said open position prior to actuation of said trigger means, and for releasing said conductor engaging portions from said open position and permitting them to move to said closed position when actuated, said trigger means including a rigid trigger arm extending from a first one of said gripping fingers in fixed angular relation to said conductor engaging portion of said first gripping finger, said trigger arm being movable between a cocked position, wherein said conductor engaging portions are held in said open position, and an actuated position, wherein said conductor engaging portions are permitted to move to said closed position; and
   biasing means disposed between said gripping fingers and said body for urging said conductor engaging portions of said gripping fingers into said closed position upon actuation of said trigger means.

18. A sensor for sensing a faulted condition in a conductor, comprising:
- a protective body having faulted circuit indicating means disposed therewithin and a conductor supporting portion adapted for receiving and engaging the conductor in a predetermined position with respect to said faulted circuit indicating means;
- a pair of gripping fingers disposed on opposite sides of said protective body and each having a conductor engaging portion and a finger mounting portion, said finger mounting portions being adapted for mounting said gripping fingers on said body and permitting said conductor engaging portions to be moved alternately between an open position adjacent to but spaced from the conductor, and a closed position engaging the conductor and holding it in said predetermined position on said body;
- trigger means disposed on said gripping fingers for holding said conductor engaging portions of said gripping fingers in said open position prior to actuation of said trigger means, and for releasing said conductor engaging portions from said open position and permitting them to move to said closed position when actuated; and
- biasing means disposed between said gripping fingers and said body for urging said conductor engaging portions of said gripping fingers into said closed position upon actuation of said trigger means; and
- wherein said finger mounting portions of said gripping fingers each include means for rotatably mounting said gripping fingers on said body and effecting rotation of said conductor engaging portions between said open and closed positions, and wherein said trigger means includes a trigger arm extending from one of said gripping fingers, and a trigger arm receptacle disposed on the other of said gripping fingers for releasably receiving said trigger arm therewithin, said trigger arm and said receptacle being rotatable from a cocked position wherein said trigger arm and said receptacle are held against movement with respect to said body and said conductor engaging portions are held in said open position, to an actuated position wherein said trigger arm is released from said receptacle and said conductor engaging portions are permitted to rotate to said closed position.

19. A sensor for sensing a faulted condition in a conductor, comprising;
- a protective body having faulted circuit indicating means disposed therewithin and a conductor supporting portion adapted for receiving and engaging the conductor in a predetermined position with respect to said faulted circuit indicating means;
- a pair of gripping fingers disposed on opposite sides of said protective body and each having a conductor engaging portion and a finger mounting portion, said finger mounting portions being adapted for mounting said gripping fingers on said body and permitting said conductor engaging portions to be moved alternately between an open position adjacent to but spaced from the conductor, and a closed position engaging the conductor and holding it in said predetermined position on said body;
- trigger means disposed on said gripping fingers for holding said conductor engaging portions of said gripping fingers in said open position prior to actuation of said trigger means, and for releasing said conductor engaging portions from said open position and permitting them to move to said closed position when actuated; and
- biasing means disposed between said gripping fingers and said body for urging said conductor engaging portions of said gripping fingers into said closed position upon actuation of said trigger means; and
- wherein said finger mounting portions of said gripping fingers each include means for rotatably mounting said gripping fingers on said body and effecting rotation of said conductor engaging portions between said open and closed positions, and wherein said trigger means includes a trigger arm extending from each of said gripping fingers and engageable with one another at their free ends, the free end of one of said trigger arms having a depression therein and the free end of the other of said trigger arms having a projection releasably engageable with said depression, said trigger arms being rotatable from a cocked position wherein said trigger arms are frictionally retained against movement with respect to said body and said conductor engaging portions are held in said open position, to an actuated position wherein said projection of one of said trigger arms is released from said depression of the other of said trigger arms, and said conductor engaging portions are permitted to rotate to said closed position.

20. The sensor of claim 18, wherein said trigger arm is received in said receptacle and held in said cocked position forward of a plane through the axes of rotation of said gripping fingers, such that said trigger arm and said receptacle are rotated toward such plane when moved to said actuated position.

21. The sensor of claim 19, wherein said projection on one of said trigger arms is retained in said depression in the other of said trigger arms and held in cocked position forward of a plane through the axes of rotation of said gripping fingers, such that said trigger arms are rotated toward such plane when moved to said actuated position.

* * * * *